(12) United States Patent
Schenck et al.

(10) Patent No.: US 8,952,515 B1
(45) Date of Patent: Feb. 10, 2015

(54) SIGNAL SHIFTING TO ALLOW INDEPENDENT CONTROL OF IDENTICAL STACKED MEMORY MODULES

(75) Inventors: Robert Naylor Schenck, Shingle Springs, CA (US); Steven Eskildsen, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 313 days.

(21) Appl. No.: 13/493,744

(22) Filed: Jun. 11, 2012

Related U.S. Application Data

(63) Continuation of application No. 12/463,329, filed on May 8, 2009, now Pat. No. 8,198,717.

(51) Int. Cl.
  *H01L 23/02* (2006.01)
(52) U.S. Cl.
  USPC .......................................... 257/686
(58) Field of Classification Search
  USPC ......... 257/685–686, 688, 693, 774, 777, 775, 257/786, 778
  See application file for complete search history.

(56) References Cited

U.S. PATENT DOCUMENTS

| | | |
|---|---|---|
| 8,198,717 B1 | 6/2012 | Schenck et al. |
| 2008/0303173 A1 | 12/2008 | Hamada et al. |
| 2010/0025833 A1* | 2/2010 | Pagaila et al. ................. 257/686 |

* cited by examiner

*Primary Examiner* — Hoa B Trinh
(74) *Attorney, Agent, or Firm* — Schwegman Lundberg & Woessner, P.A.

(57) ABSTRACT

Apparatus and methods are disclosed to allow independent control of stacked memory modules. In one embodiment, an apparatus may comprise first, second, and third modules, each of the first, second and third modules having a plurality of stacked memory dice, at least some of the plurality of stacked memory dice including a Chip Enable (CE) signal electrically accessible from a bottom surface of a corresponding module of the first, second and third modules. The apparatus may comprise a Package-on-Package (PoP) structure where the first, second and third modules are attached to one another such that an individual access to each CE signal associated with the PoP structure is provided from the bottom surface of the corresponding module.

21 Claims, 5 Drawing Sheets

SIGNAL SHIFTING TO ALLOW INDEPENDENT CONTROL OF IDENTICAL STACKED MEMORY MODULES

PRIORITY APPLICATION

This application is a continuation of U.S. application Ser. No. 12/463,329, filed May 8, 2009, now U.S. Pat. No. 8,198,717 which is incorporated herein by reference in its entirety.

BACKGROUND INFORMATION

Die stacking integrates semiconductor devices vertically in a single package in order to directly influence the amount of silicon that can be included in a given package footprint. Die stacking simplifies the surface-mount pc-board assembly and conserves pc-board real estate because fewer components are placed on the board. Die stacking has included different memory combinations that place flash memory with SRAM and RAM. Die stacking has evolved to multiple die stacks and side-by-side combinations of stacked and unstacked dies within a package.

The dies are mounted on a substrate which may then be bumped to create either a Chip Scale Package (CSP) or a Ball Grid Array (BGA) as the final package. Present die stacking techniques include mounting smaller dies onto larger ones to enable wire bonding of both, as well as techniques for stacking same-size die. To further increase the memory density and memory bandwidth available in a given size footprint, Package-on-Package (PoP) may be utilized to vertically connect multiple packages such as a logic package with a memory package, where each package may contain one or more die. Still, improvements in packaging are needed as the number of stacked-die in a package is expanded.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
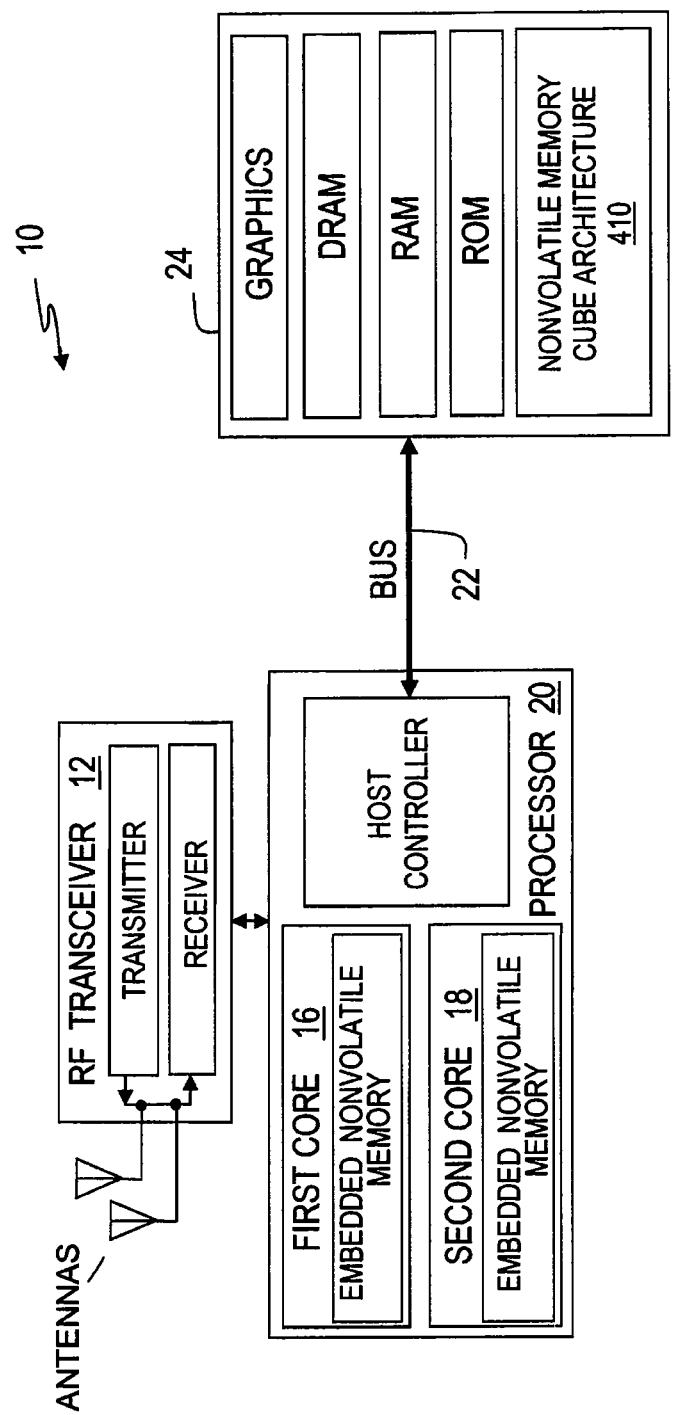
FIG. 1 is an embodiment of a wireless device connected to mass storage having Phase-Change Memory (PCM) in vertically interconnected multiple identical memory packages in a cube architecture in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

In one embodiment, an apparatus may comprise first, second, and third modules, each of the first, second and third modules having a plurality of stacked memory dice, at least some of the plurality of stacked memory dice including a Chip Enable (CE) signal electrically accessible from a bottom surface of a corresponding module of the first, second and third modules. The apparatus may comprise a PoP structure where the first, second and third modules are attached to one another such that an individual access to each CE signal associated with the PoP structure is provided from the bottom surface of the corresponding module. Various embodiments are described below with respect to FIGS. 1-5.

The wireless architecture embodiment illustrated in FIG. 1 shows a system 10 that includes a processor that communicates with a mass storage device 24 in accordance with the present invention. System 10 may include one or more antennas to allow a radio to communicate with other over-the-air communication devices. As such, system 10 may operate in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, or close proximity Bluetooth technology, although the present invention is not limited to operate in only these networks. The radio subsystems collocated in the same platform of system 10 may provide the capability of communicating with different frequency bands in an RF/location space with other devices in a network. It should be understood that the scope of the present invention is not limited by the types, the number, or the frequency of the communication protocols that may be used by system 10.

The embodiment illustrates the coupling of an antenna structure to a transceiver 12 to accommodate modulation/demodulation. In general, analog front end transceiver 12 may be a stand-alone Radio Frequency (RF) discrete or integrated analog circuit, or transceiver 12 may be embedded with a processor 20 having one or more processor cores 16 and 18. The multiple cores allow processing workloads to be shared across the cores and handle baseband functions and application functions. Data and instructions may transfer through an interface 22 between the processor and memory storage in mass storage device 24.

Mass storage device 24 may include both volatile and nonvolatile memories. Many wireless applications in mobile products have stringent packaging constraints that need a reduced footprint for at least a portion of the memory in the mass storage device 24. In accordance with the present invention, the mass storage device incorporates both die-stacking and a Package-On-Package technology 410.

Figure 2:
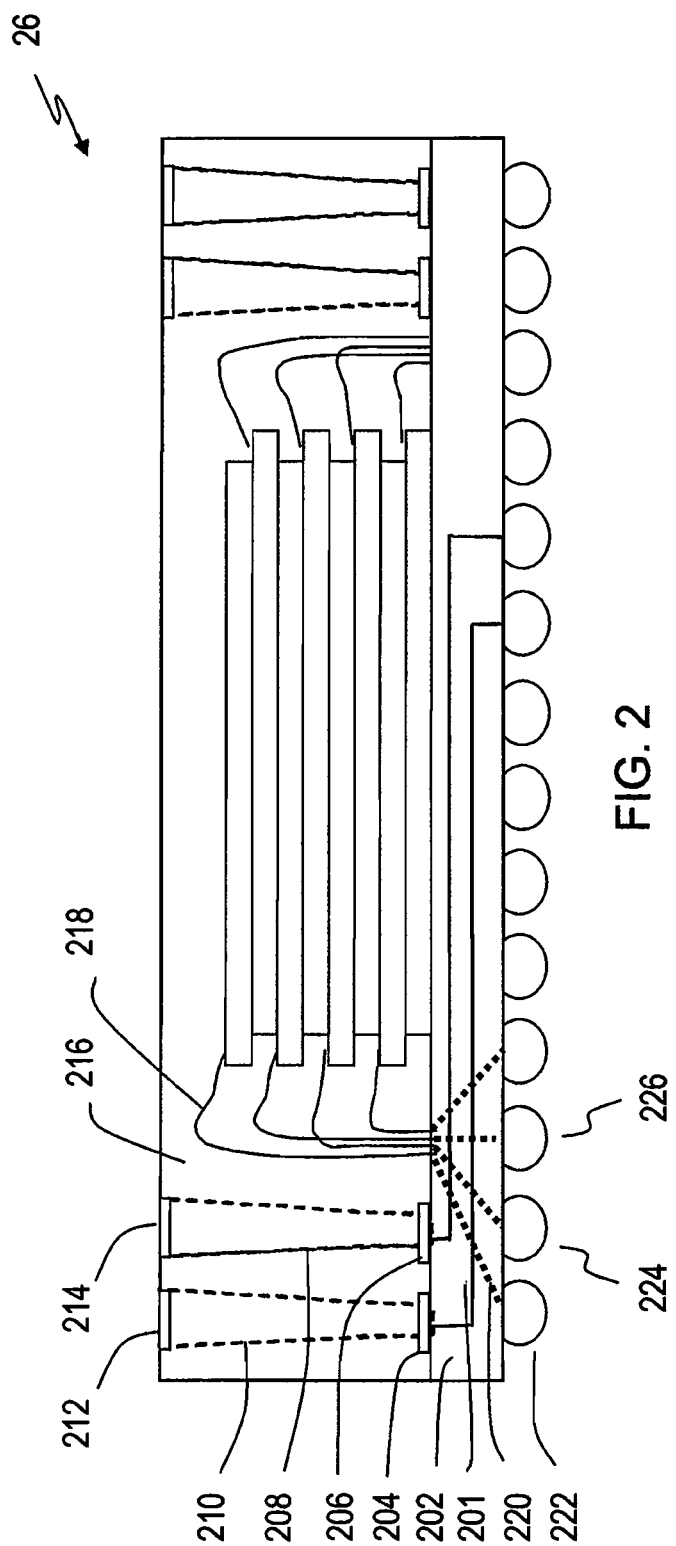
FIG. 2 illustrates a die-stacking module having vias in the mold and Chip Enable signals shifted to new locations as these signals pass from the top of the vias, through the package substrate and down to the solder balls in accordance with the present invention.

FIG. 2 illustrates eight memories stacked one on top of another, with wire bonds providing electrical connections from pads on the substrate of the memory die to pad sites located on a surface of the package substrate. Although the figure shows eight memory dice in die-stacking module 26, it should be understood that this number of memory die is not limiting to the present invention and other embodiments may encompass a different number of memory die. The embodiment illustrates independently controlling the die within each package of a PoP structure by providing a unique Chip Enable (CE) signal at the bottom of the PoP memory structure. The embodiment shows shifting the CE signal within identical packages in the PoP memory structure for example, but the technique may be used for stacking die-on-die, or any plurality of memory modules.

The different embodiments for die-stacking module 26 include a variety of nonvolatile memory technologies. One embodiment incorporates nonvolatile memory having a phase change material. The Phase Change Memory (PCM) may be referred to as a Phase-Change Random Access Memory (PRAM or PCRAM), Ovonic Unified Memory (OUM) or Chalcogenide Random Access Memory (C-RAM). The arrays of PCM cells include alloys of elements of group VI of the periodic table, elements such as Te or Se that are referred to as chalcogenides or chalcogenic materials. The chalcogenide cells may be used advantageously to provide data retention, where the data remains stable even after the power is removed from the nonvolatile memory. Taking the phase change material as $Ge_2Sb_2Te_5$ for example, two phases or more are exhibited having distinct electrical characteristics useful for memory storage.

In another embodiment the nonvolatile memories in die-stacking module 26 may be Magnetic Random Access Memory (MRAM) cells. In these cells magnetic storage elements are formed from two ferromagnetic plates (not shown) located at an intersection of a row and column line and selected by a Magnetic Tunnel Junction (MTJ) device (not shown). Current imparted to the row line in one direction causes a magnetic field operative on the MRAM cell biasing the MRAM cell toward a binary state. Due to a magnetic tunnel effect, the electrical resistance of the memory cell changes based on the orientation of the fields in the two plates.

In yet another embodiment the nonvolatile memory arrays in die-stacking module 26 may be Ferroelectric Random Access Memory (FRAM) cells. The transistor-capacitor cell (not shown) includes the ferroelectric material where a bi-stable atom is shifted to form two stable polarization states. Memory cell data may be written by positively or negatively orienting the dipoles of the ferroelectric material via an applied polarizing voltage. Read control circuitry senses the direction of the stable electric polarization that remains in place even after the electric field is removed.

With reference to FIG. 2, the bond pads on each memory die are preferably located along one edge of the die, or alternatively, located on the top surface on opposing sides of the die. Limits on the bond site placements facilitate access by a wire bonding tool to the pads for down bonding to a surface of the package substrate. Placement of memory die in the stacking process calls for one die to be placed on top of another with or without spacers separating the die. The figure shows die stacking without the use of separators or spacers, and further shows the die being stair-stepped to prevent physical contact of a die to the bond wires of the die below it. Although the figure shows every other die being stair-stepped, any number of die may be stair-stepped before repeating. Further, the stacking process may also include rotating each successively placed memory die by 90 degrees or 180 degrees relative to the previous memory die in the stack. Thus, to facilitate wire bonding capabilities in stacking multiple devices in a Ball Grid Array (BGA) surface mount module, decisions may be based on the bond pad placements as designed on the memory die to determine any need for separators, the stacking order, the thickness of the memory die substrates, and their stair-stepping and die rotation configurations.

FIG. 2 also shows upper connections 204, 206 on the top of a package substrate 202 extended vertically through a package mold 216 to create electrical pads 212, 214 on the top of the die-stacking module 26. The connection may be completed by drilling vias 208, 210 into the mold and then filling the vias with a solder paste, electrically conductive adhesives, or other suitable electrically conductive materials. Alternatively, solder or metal pillars may be in place prior to the mold process, where a grinding process on the finished mold exposes the metal for the electrical pads 212, 214.

In accordance with the present invention, the CE signals, such as the chip enable signal for the top die 218, may be down bonded from a bond pad on the memory die to the package substrate, where an interconnect trace signal 220 electrically routes that CE to one of the upper connections on the package substrate 202 that is further electrically connected to a solder ball such as, for example, solder ball 222. In some embodiments the CE signals from the various memory die may be kept separate. Thus, with eight memory die in die-stacking module 26 there are eight CE signals, with each CE signal accessible through a separate solder ball. However, in other embodiments one or more of the CE signals may be combined through trace signals in the package substrate 202, and thus, fewer than eight CE signals made available through the solder balls.

Note that the CE signals in each die-stacking module 26 are shifted between the bottom solder balls and the top lands. By way of example, electrical pad 212 is not connected to the solder ball 222 that lies beneath that pad, but rather, electrical pad 212 is shifted by trace signal 201 in package substrate 202 to electrically connect to solder ball 224. Similarly, electrical pad 214 is not connected to the solder ball 224 that lies beneath that pad, but rather, electrical pad 214 is also shifted by a trace to electrically connect to solder ball 226.

Figure 3:
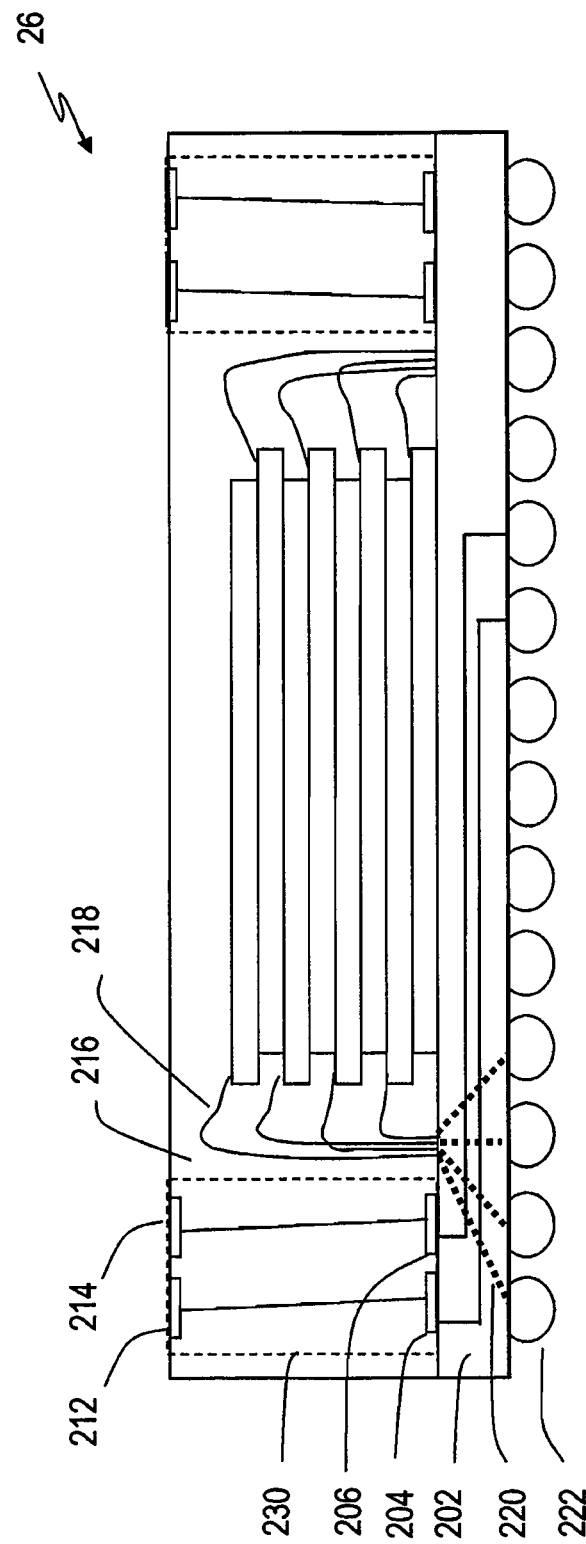
FIG. 3 illustrates a die-stacking module using a laminated board to provide electrical connections and Chip Enable signals shifted to new locations as these signals pass from the top of the vias, through the package substrate and down to the solder balls in accordance with the present invention.

FIG. 3 illustrates another embodiment that utilizes a laminated board 230 to provide a connection between upper connection 204 on the package substrate 202 and the electrical pad 212 on the top of die-stacking module 26. In addition, laminated board 230 provides connections between upper connection 206 and electrical pad 214, and so forth. Thus, laminated board 230 provides a plurality of electrical connections between the top of the package substrate 202 and the top of the die-stacking module 26. While the figure shows a vertical connection in the laminated board and the physical shifting of signals occurring in the package substrate, it is also possible to have the signals shifted in the laminated board.

Figure 4:
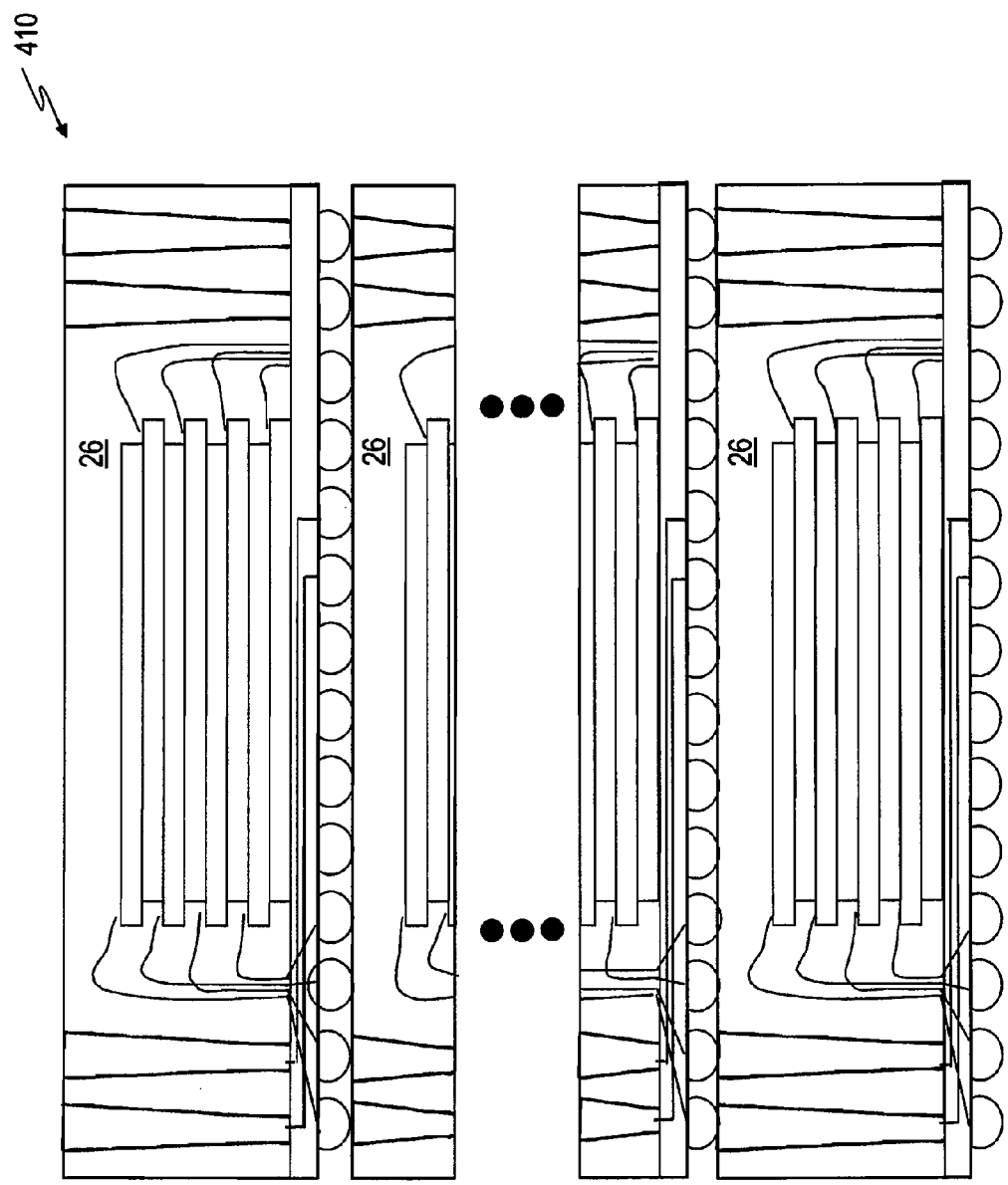
FIG. 4 illustrates a plurality of die-stacking modules in a Package-On-Package assembly in accordance with the present invention.

FIG. 4 illustrates a plurality of die-stacking modules 26 that are interconnected to form a Package-On-Package 410. In one embodiment, eight die-stacking modules 26 may be stacked one on top of another to form a cube architecture, although any number of modules may be stacked without limiting the claimed features. It should be pointed out that the die-stacking modules 26 are identical, and therefore, there is no distinguishing feature to dictate the order of placement within the stack. In other words, the die-stacking modules 26 are interchangeable, one with another, within Package-On-Package 410.

Figure 5:
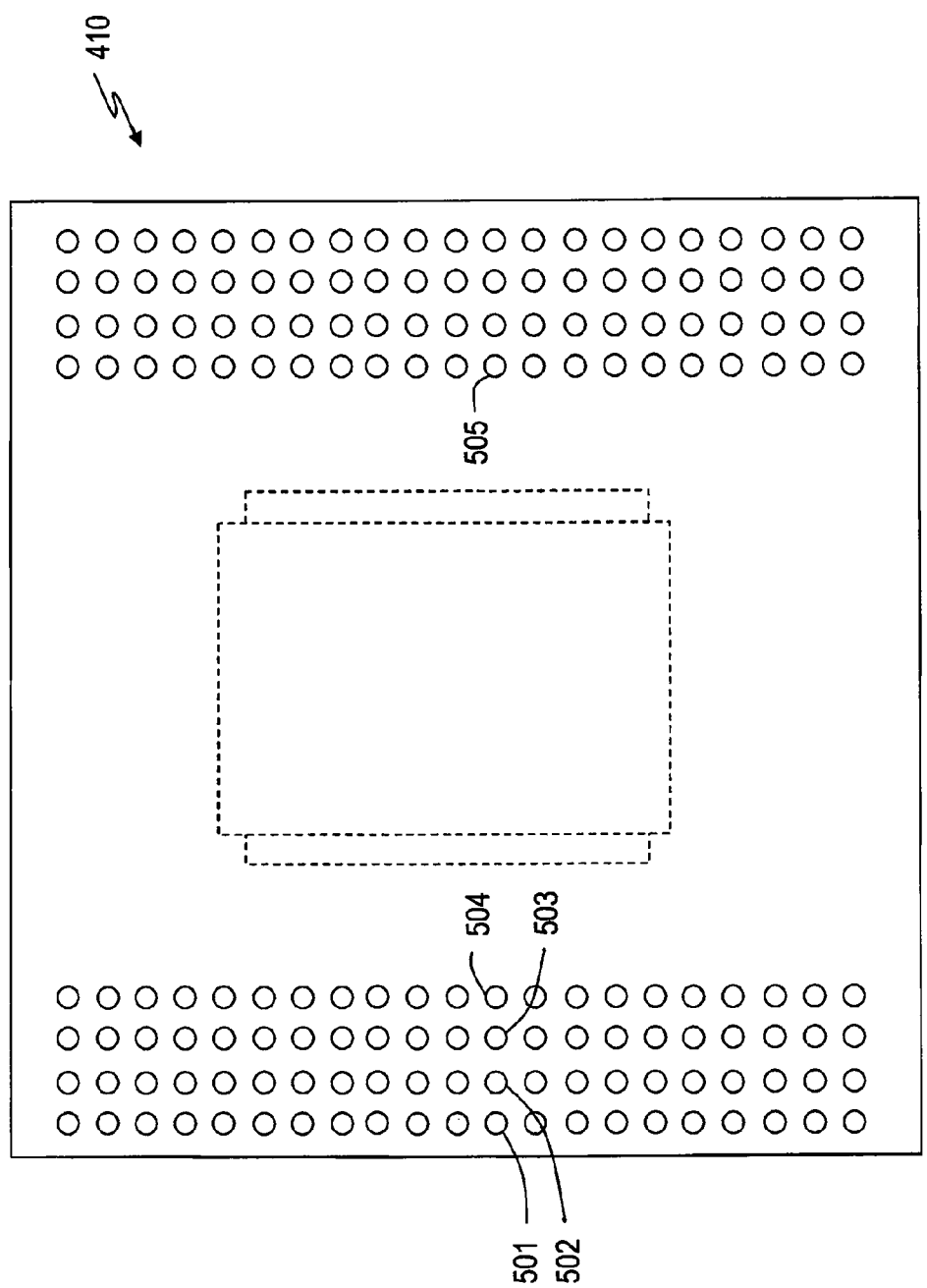
FIG. 5 is a bottom view of the Package-On-Package assembly that provides a separate Chip Enable for each memory die in the package in accordance with the present invention.

FIG. 5 illustrates a bottom view of a memory cube, i.e., the bottom of Package-On-Package 410. As previously described, memory die have been wire bonded and overmolded in a ball grid array package, then placed one on top of another in a Package-On-Package technology. The chip enable signal for the top die in the bottom module appears on solder ball 501. The top die's chip enable in the second module appears on solder ball 502. This continues, with the chip enable for the top die in the third module appearing on solder ball 503, the chip enable for the top die fourth module appearing on solder ball 504, and the chip enable for the top die in the fifth module appearing on solder ball 505, etc.

If each die-stacking module 26 included eight memory die, then eight CE signals are electrically coupled to a separate solder ball, and therefore, individually accessible. Thus, in the embodiment where Package-On-Package 410 includes eight die-stacking modules 26, the bottom view would have eight groups, where each group includes eight CE signals. The shifting of the CE signals between the bottom solder balls and the top lands in each die-stacking module 26 is the cube architecture having individual control of each memory die by the separate CE signals applied to the corresponding solder balls. In other words, the CE connections that are daisy-chained through the cube architecture provide individual control of each memory die through the solder balls at the bottom of Package-On-Package 410.

By now it should be apparent that embodiments of the present invention allow increased memory storage efficiencies by using features of the present invention in die-stacking modules that are connected in a Package-On-Package. By shifting of the CE signals the die-stacking module and daisy-chaining those signals through the Package-On-Package, individual control of each memory die is maintained.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A memory device, comprising:
    first, second, and third modules, each of the first, second and third modules having a plurality of stacked memory dice, at least some of the plurality of stacked memory dice including a Chip Enable (CE) signal electrically accessible from a bottom surface of a corresponding module of the first, second and third modules; and
    a Package-on-Package (PoP) structure where the first, second and third modules are attached to one another such that an individual access to each CE signal associated with the PoP structure is provided from the bottom surface of the corresponding module.

2. The memory device of claim 1, wherein the first, second, and third modules are identical.

3. The memory device of claim 1, wherein the first, second and third modules are interchangeable in the PoP structure, with respect to providing individual access to each CE signal in the PoP structure.

4. The memory device of claim 1, where the first module includes one or more CE pads, each CE pad being down bonded to a substrate that supports the plurality of memory dice in the first module for electrical connection to a different solder connection at the bottom surface of the first module.

5. The memory device of claim 1, wherein the first module includes a mold having at least one filled via extending from a top of the mold to a top of a package substrate.

6. The memory device of claim 5, wherein the CE signals received by the first module from an above attached module are to be passed through the at least one filled via.

7. The memory device of claim 1, wherein at least one of the plurality of memory dice comprises a PCM (Phase-Change Memory) die, a MRAM (Magnetic Random Access Memory) die or a FRAM (Ferroelectric Random Access Memory) die.

8. A memory device, comprising:
    a plurality of modules attached to each other to form a Package-on-Package (PoP) structure, at least one module of the plurality of modules including a plurality of memory dice stacked over one another, each of the plurality memory dice including a Chip Enable (CE) signal connected to a different solder connection at the bottom surface of the at least one module via an electrical trace in a package substrate that supports the plurality of memory dice, the at least one module being interchangeable in the PoP structure with another one of the plurality of modules, with respect to providing individual access to each CE signal in the PoP structure.

9. The memory device of claim 8, where the at least one module includes one or more CE pads, each of the CE pads being down bonded to a substrate for electrical connection to another different solder connection at the bottom surface of the at least one module.

10. The memory device of claim 8, wherein the at least one module includes a mold having at least one filled via extending from a top of the mold to a top of a package substrate that supports the plurality of memory dice in the at least one module.

11. The memory device of claim 8, wherein the CE signals originating from the at least one module are to be shifted via the electrical trace.

12. The memory device of claim 8, wherein at least one of the plurality of memory dice comprises a PCM (Phase-Change Memory) die, a MRAM (Magnetic Random Access Memory) die or a FRAM (Ferroelectric Random Access Memory) die.

13. The memory device of claim 8, wherein each of the plurality of memory dice comprise a same type of memory die.

14. A memory device, comprising:
    a plurality of modules attached to each other to form a Package-on-Package (PoP) structure, at least one module of the plurality of modules including a plurality of memory dice stacked over one another, each of the plurality memory dice including a Chip Enable (CE) signal, the at least one module including a plurality of CE pads, each of the plurality of CE pads down bonded, via a substrate supporting the plurality of memory dice, to a different solder ball at the bottom surface of the at least one module, the at least one module being interchangeable with another one of the plurality of modules in the PoP structure.

15. The memory device of claim 14, wherein the at least one module includes a mold having at least one filled via extending from a top of the mold to a top of the substrate.

16. The memory device of claim 15, wherein the CE signals incoming to the at least one module from an above attached module are to be passed through the at least one filled via, and wherein the CE signals originating from the at least one module are to be shifted via an electrical trace in the package substrate.

17. The memory device of claim 14 wherein at least one of the plurality of memory dice comprises a PCM (Phase-Change Memory) die, a MRAM (Magnetic Random Access Memory) die or a FRAM (Ferroelectric Random Access Memory) die.

18. The memory device of claim 14, wherein at least two of the plurality of memory dice comprise a same type of memory die.

19. A memory device, comprising:
a plurality of modules attached to each other to form a Package-on-Package (PoP) structure, at least one module of the plurality of modules including a plurality of memory dice stacked over one another, each of the plurality memory dice including a Chip Enable (CE) signal connected to a different solder connection at the bottom surface of the at least one module via an electrical trace in a package substrate that supports the plurality of memory dice, the at least one module including a mold having at least one filled via extending from a top of the mold to a top of a package substrate that supports the plurality of memory dice in the at least one module.

20. A memory device, comprising:
a plurality of die-stacking modules providing separate Chip Enable (CE) signals for all memory dice in the die-stacking modules within a Package-on-Package (PoP), a first die-stacking module of the plurality of die-stacking modules including a laminated board having a plurality of electrical connections contained therein to electrically couple between an upper portion of a package substrate that supports a set of the memory dice in the first die-stacking module to an upper portion of the first die-stacking module.

21. The memory device of claim 20, wherein the first die-stacking module is configured to pass the CE signals through the electrical connections and an electrical trace in the package substrate to shift the CE signals to pass through the first die-stacking module.

* * * * *